United States Patent
Park et al.

(10) Patent No.: US 7,608,546 B2
(45) Date of Patent: Oct. 27, 2009

(54) METHOD FOR FABRICATING A SEMICONDUCTOR DEVICE

(75) Inventors: Sang-Soo Park, Ichon-shi (KR); Chang-Heon Park, Ichon-shi (KR); Dong-Ryeol Lee, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/765,673

(22) Filed: Jun. 20, 2007

(65) Prior Publication Data

US 2008/0160653 A1    Jul. 3, 2008

(30) Foreign Application Priority Data

Dec. 27, 2006    (KR) .............. 10-2006-0134327

(51) Int. Cl.
*H01L 21/302* (2006.01)
*H01L 21/461* (2006.01)

(52) U.S. Cl. .................. 438/740; 438/9; 257/E21.007; 257/E21.227; 257/E21.231; 257/E21.249

(58) Field of Classification Search ................ 438/694, 438/695, 703, 706, 710, 711, 713, 717, FOR. 120, 438/9, 740, 504, 510, 636, 780
See application file for complete search history.

(56) References Cited

U.S. PATENT DOCUMENTS

| 7,473,647 | B2* | 1/2009 | Lee et al. ..................... 438/706 |
| 2006/0124587 | A1* | 6/2006 | Lee .............................. 216/47 |
| 2006/0234166 | A1* | 10/2006 | Lee et al. ..................... 430/313 |
| 2006/0292886 | A1* | 12/2006 | Nam et al. ................... 438/725 |
| 2007/0249170 | A1* | 10/2007 | Kewley ...................... 438/706 |

FOREIGN PATENT DOCUMENTS

| CN | 1490867 | 4/2004 |
| CN | 1722409 | 1/2006 |
| KR | 1020050035359 A | 4/2005 |
| KR | 1020050122737 A | 12/2005 |

* cited by examiner

*Primary Examiner*—David Nhu
(74) *Attorney, Agent, or Firm*—Townsend and Townsend and Crew LLP

(57) ABSTRACT

A method for fabricating a semiconductor device includes forming an etch target layer over a substrate that includes a cell region and a peripheral region. A first hard mask layer, a second hard mask layer, and an anti-reflective coating layer are formed over the etch target layer. A photosensitive pattern is formed over the anti-reflective coating layer. The anti-reflective coating layer is etched to have a width smaller than the width of the photosensitive pattern. The second hard mask layer is etched. A main etching and an over-etching are performed on the first hard mask layer. The etch target layer is then etched.

21 Claims, 5 Drawing Sheets

METHOD FOR FABRICATING A SEMICONDUCTOR DEVICE

CROSS-REFERENCE TO RELATED APPLICATIONS

The present invention claims priority of Korean patent application number 10-2006-0134327, filed on Dec. 27, 2006, which is incorporated by reference in its entirety.

BACKGROUND OF THE INVENTION

The present invention relates to a method for fabricating a semiconductor device and, more particularly, to a method for forming a pattern in a semiconductor device.

When gate patterns are formed, critical dimensions (CDs) of the gate patterns in a peripheral region affect an electric characteristic of a semiconductor device. Therefore, adjusting the CDs of the gate patterns in the peripheral region according to the characteristics of the semiconductor device is generally necessary.

However, because of a difference in the pattern density between a peripheral region and a cell region, a loading effect arises. Thus, the gate patterns in the peripheral region are formed with larger CDs than the CDs of the gate patterns in the cell region. Accordingly, although the CDs of the gate patterns in the peripheral region need to be decreased by reducing CDs of mask patterns, reducing the CDs of the mask patterns may be limited because, as devices are minimized, the mask patterns are likely to collapse.

SUMMARY OF THE INVENTION

Specific embodiments of the present invention are directed toward providing a method for fabricating a semiconductor device having a reduced critical dimension of a target pattern in a peripheral region.

In accordance with one aspect of the present invention, a method for fabricating a semiconductor device includes forming an etch target layer over a substrate that includes a cell region and a peripheral region. A first hard mask layer, a second hard mask layer, and an anti-reflective coating layer are formed over the etch target layer. A photosensitive pattern is formed over the anti-reflective coating layer. The anti-reflective coating layer is etched to have a width smaller than the width of the photosensitive pattern. The second hard mask layer is etched. A main etching and an over-etching are performed on the first hard mask layer. The etch target layer is then etched.

In accordance with another aspect of the present invention, a method for fabricating a semiconductor device includes forming an etch target layer over a substrate, wherein the substrate includes a cell region and a peripheral region. A first hard mask layer, a second hard mask layer, and an anti-reflective coating layer are formed over the etch target layer. A photosensitive pattern is formed over the anti-reflective coating layer. The anti-reflective coating layer is etched to have a width that is smaller than a width of the photosensitive pattern. The second hard mask layer is etched. The first hard mask layer is etched such that the first hard mask layer in the peripheral region is etched more than the first hard mask layer in the cell region, wherein the etched first hard mask layer in the cell region has a sloped profile.

DESCRIPTION OF SPECIFIC EMBODIMENTS

Figure 1A:
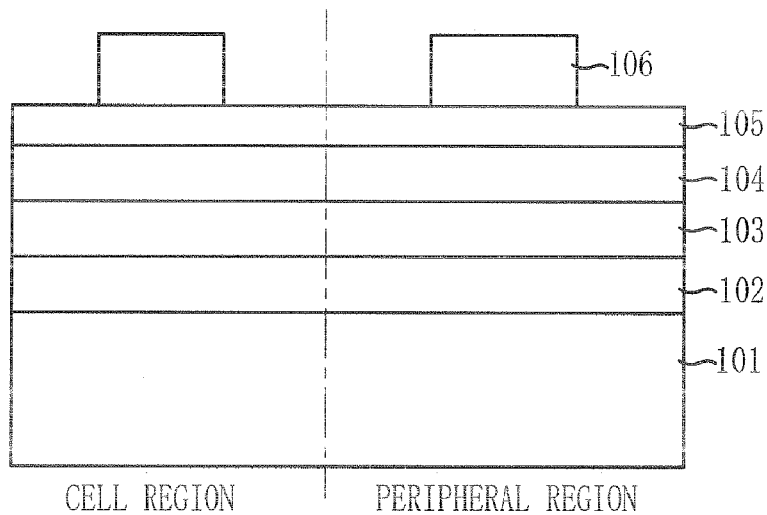
FIGS. 1A to 1E are cross-sectional views illustrating a method for fabricating a semiconductor device in accordance with an embodiment of the present invention.

FIGS. 1A to 1E are cross-sectional views illustrating a method for fabricating a semiconductor device in accordance with an embodiment of the present invention. Referring to FIG. 1A, an etch target layer 102 is formed over a substrate 101 that includes a cell region and a peripheral region. The substrate 101 may be a semiconductor substrate used in a fabrication process for dynamic random access memory (DRAM) devices. The etch target layer 102 may be used for a gate electrode or a bit line electrode. The etch target layer 102 may include polysilicon, metal or metal silicide.

A first hard mask layer 103 is formed over the etch target layer 102. The first hard mask layer 103 includes a nitride-based material. The first hard mask layer 103 serves as an etch barrier when the etch target layer 102 is etched. The first hard mask layer 103 may be used as a gate hard mask if the etch target layer 102 is for a gate electrode. Alternatively, the first hard mask layer 103 may also be as a bit line hard mask if the etch target layer 102 is for a bit line electrode.

A second hard mask layer 104 is formed over the first hard mask layer 103. The second hard mask layer 104 includes a carbon-based material. The second hard mask layer 104 serves as an etch barrier when the first hard mask layer 103 is etched. The second hard mask layer 104 may include an amorphous carbon-based material.

An anti-reflective coating layer 105 is formed over the second hard mask layer 104. The anti-reflective coating layer 105 serves as an etch barrier when the second hard mask layer 104 is etched. The anti-reflective coating layer 105 simultaneously serves as an anti-reflector when a photoresist pattern is formed. Prior to forming the anti-reflective coating layer 105, a silicon oxynitride (SiON) layer (not shown) may also be formed to provide substantially the same function as the anti-reflective coating layer 105.

A photosensitive pattern 106 is formed over the anti-reflective coating layer 105. The photosensitive pattern 106 is formed by coating a photosensitive material over the anti-reflective coating layer 105, and then performing a photo-exposure and developing treatment on the photosensitive material.

Figure 1B:
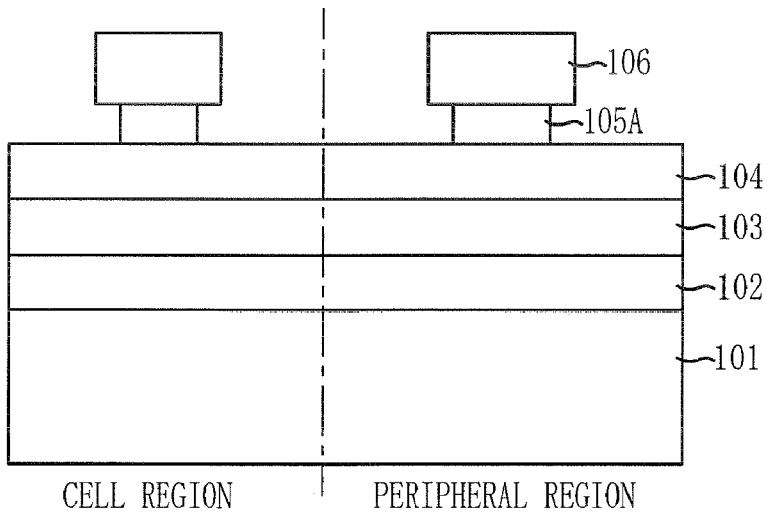

Referring to FIG. 1B, the anti-reflective coating layer 105 is etched to have a width that is smaller than the width of the photosensitive pattern 106. The anti-reflective coating layer 105 is etched using a mixture of gases including $CF_4$ and $CHF_3$ gases along with oxygen ($O_2$) gas. The $CF_4$ gas flows at a rate of approximately 50 sccm to 70 sccm, and the $CHF_3$ gas flows at a rate of approximately 30 sccm to 50 sccm. A relatively large amount of the $O_2$ gas is added compared to the conventional process. For instance, the $O_2$ gas flows at a rate of approximately 5 sccm to 10 sccm.

The anti-reflective coating layer 105 is etched using a pressure of approximately 100 mTorr to 150 mTorr, and applying a power of approximately 200 W to 400 W applied from a top region of a reaction chamber (hereinafter referred to as a top power). The etching of the anti-reflective coating layer 105 continues for approximately 50 seconds to 70 seconds. Reference number 105A represents an anti-reflective coating pattern which is formed by etching the anti-reflective coating layer 105.

As described above, when etching the anti-reflective coating layer 105, a relatively large amount of the $O_2$ gas is added to the mixture gas to activate the etching. As a result, the anti-reflective coating layer 105 can be etched such that the width of the anti-reflective coating layer 105 is smaller than the width of the photosensitive pattern 106.

Figure 1C:
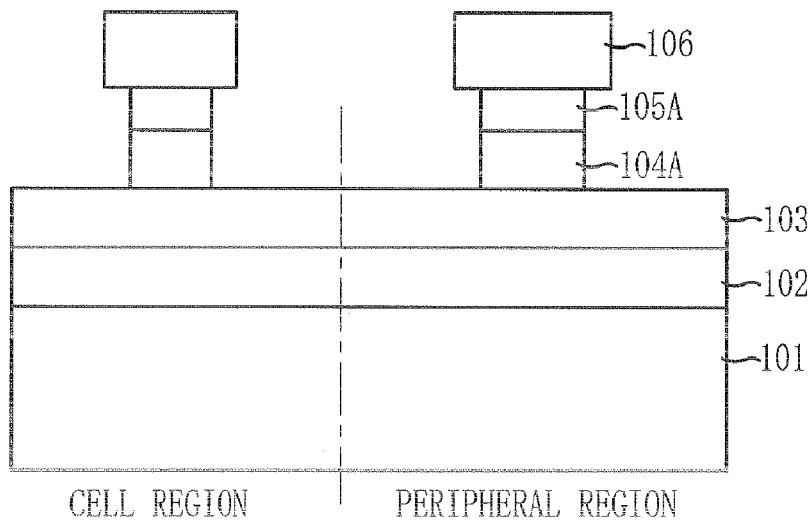

Referring to FIG. 1C, the second hard mask layer 104 (see FIG. 1B) is etched to form a second hard mask 104A. The etching of the first hard mask layer 104 proceeds under conditions of: a pressure of approximately 10 mTorr to 20 mTorr; a top power of approximately 1,400 W to 1,600 W; and a mixture gas including nitrogen ($N_2$) and $O_2$ gases. The $N_2$ gas flows at a rate of approximately 30 sccm to 50 sccm, and the $O_2$ gas flows at a rate of approximately 50 sccm to 70 sccm.

Figure 1D:
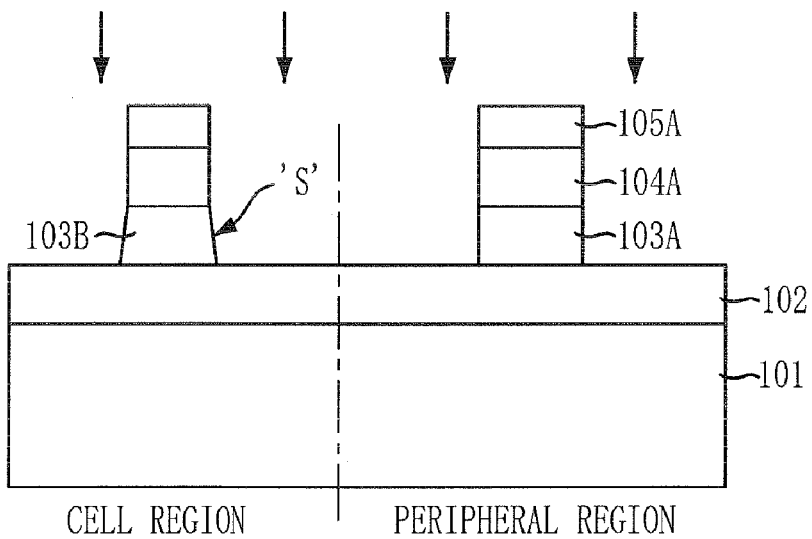

Referring to FIG. 1D, the first hard mask layer 103 is subjected to a main etching treatment and an over-etching treatment under different conditions that produce different amounts of polymers. The main etching of the first hard mask layer 103 is performed in an ending point detection mode. A gas (including a family of CHF gases) may flow at different rates to etch the first hard mask layer 103 under different conditions that produce different amounts of polymers.

For the main etching treatment, a mixture gas including $CHF_3$ gas and $CF_4$ gas is used, and $O_2$ gas is added to the mixture gas. The $CHF_3$ gas flows at a rate of approximately 20 sccm to 40 sccm, and the $CF_4$ gas flows at a rate of approximately 80 sccm to 100 sccm. The $O_2$ gas flows at a rate of approximately 5 sccm to 10 sccm. The main etching proceeds under conditions of: a pressure of approximately 100 mTorr to 200 mTorr; a top power of approximately 100 W to 200 W; and a bottom power of approximately 700 W to 800 W. The bottom power is the power applied from a bottom region of the reaction chamber, and will be referred to as a bottom power hereinafter.

For the over-etching treatment, $CHF_3$ gas is used with $O_2$ gas. A flow rate of the $CHF_3$ gas ranges from approximately 90 scam to 110 scam, and a flow rate of the $O_2$ gas ranges from approximately 5 scam to 10 scam. The over-etching proceeds under conditions of: a pressure of approximately 100 mTorr to 200 mTorr; a top power of approximately 100 W to 200 W; and a bottom power of approximately 700 W to 800 W.

When the main etching and the over-etching are performed under different conditions that produce different amounts of polymers, the first hard mask layer 103 in the cell region is etched to have a sloped profile because of the large amounts of polymers produced by the $CHF_3$ gas during the over-etching treatment. The sloped profile allows adjustment of a critical dimension (CD) of a pattern structure that is etched to have a smaller width than that of the photosensitive pattern 106 in the cell region. Reference denotation 'S' represent the sloped profile, and reference numerals 103A and 103B represent a first hard mask and a sloped first hard mask, respectively. The first hard mask 103A is formed by performing the over-etching on the first hard mask layer 103 in the peripheral region, and the sloped first hard mask 103B is formed by performing the main-etching on the first hard mask layer 103 in the cell region.

An etch rate in the peripheral region is greater than the etch rate in the cell region. Thus, the over-etching has already started in the peripheral region when the over-etching in the cell region is initiated. Hence, the over-etching performed in the peripheral region using the $CHF_3$ gas is less likely to provide the sloped profile compared with the over-etching in the cell region.

The anti-reflective coating layer 105 is etched to have a smaller width than that of the photosensitive pattern 106. As a result, the overall CD of the resultant structure decreases. The main etching and the over-etching are performed to etch the first hard mask layer 103 such that the CD remains substantially the same in the peripheral region while the CD increases in the cell region. Therefore, the resultant pattern structure in the cell region can be formed to have a CD substantially the same as the CD of the photosensitive pattern 106, while the resultant pattern structure in the peripheral region can be formed to have a CD that is smaller than the CD of the photosensitive pattern 106. Based on this result, the CD of the resultant pattern structure in the peripheral region can be reduced without decreasing the CD of the photosensitive pattern 106. As a result, a CD bias in the peripheral region can also be reduced.

Figure 1E:
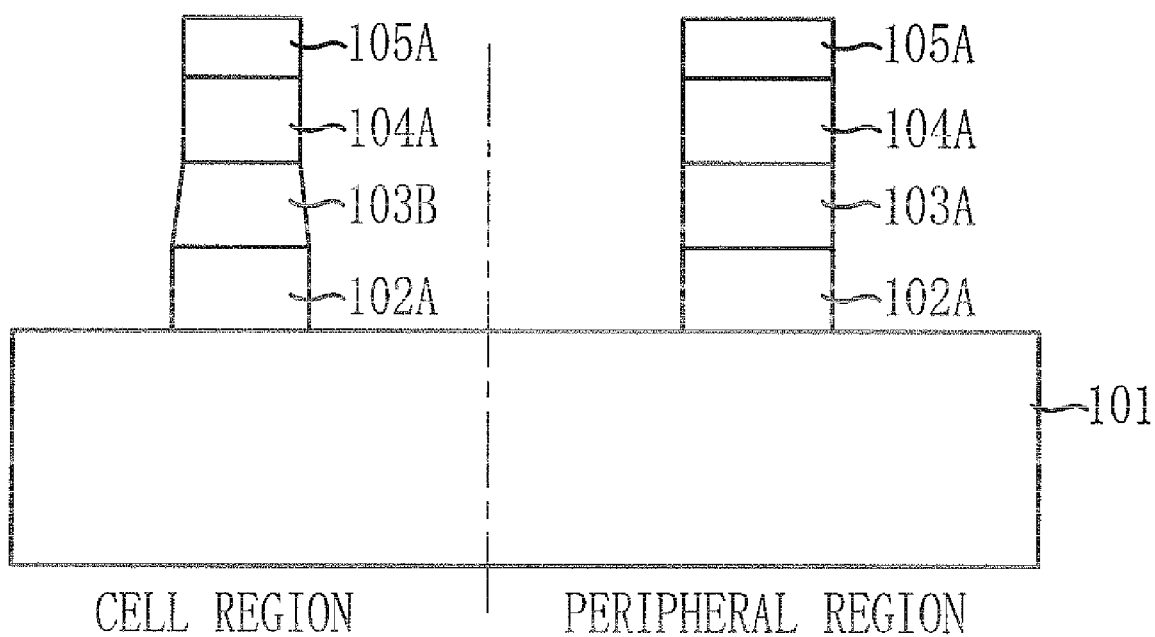

Referring to FIG. 1E, the etch target layer 102 is etched to become a patterned etch target layer 102A.

Figure 2A:
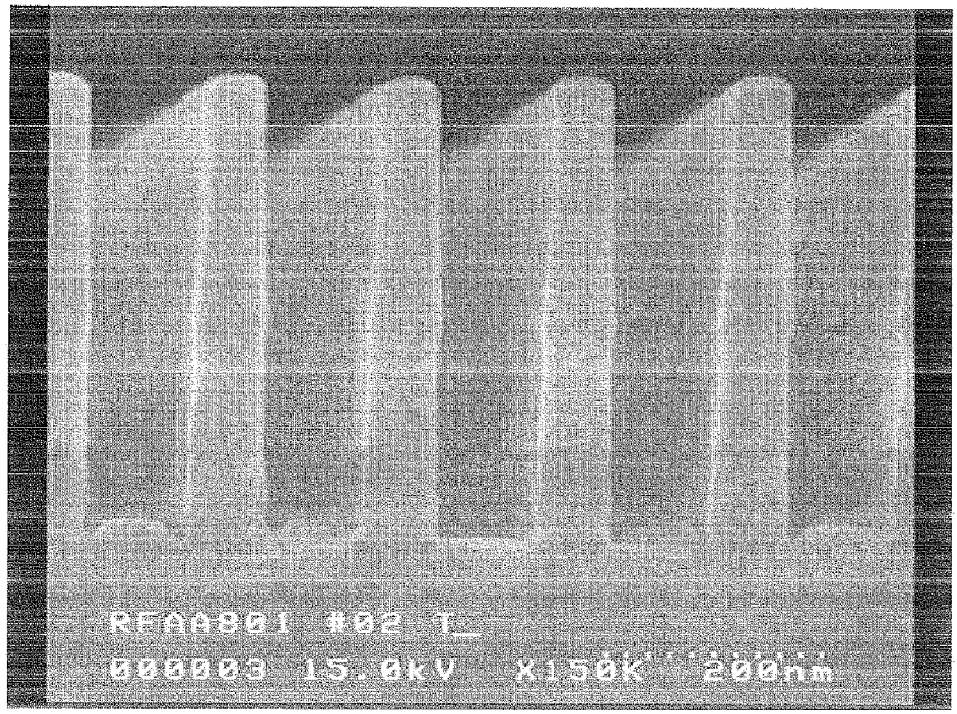
FIGS. 2A and 2B illustrate comparative transmission electron microscopic (TEM) images of patterns formed in a cell region and a peripheral region according to a conventional method and an embodied method of the present invention, respectively.
Figure 2A:
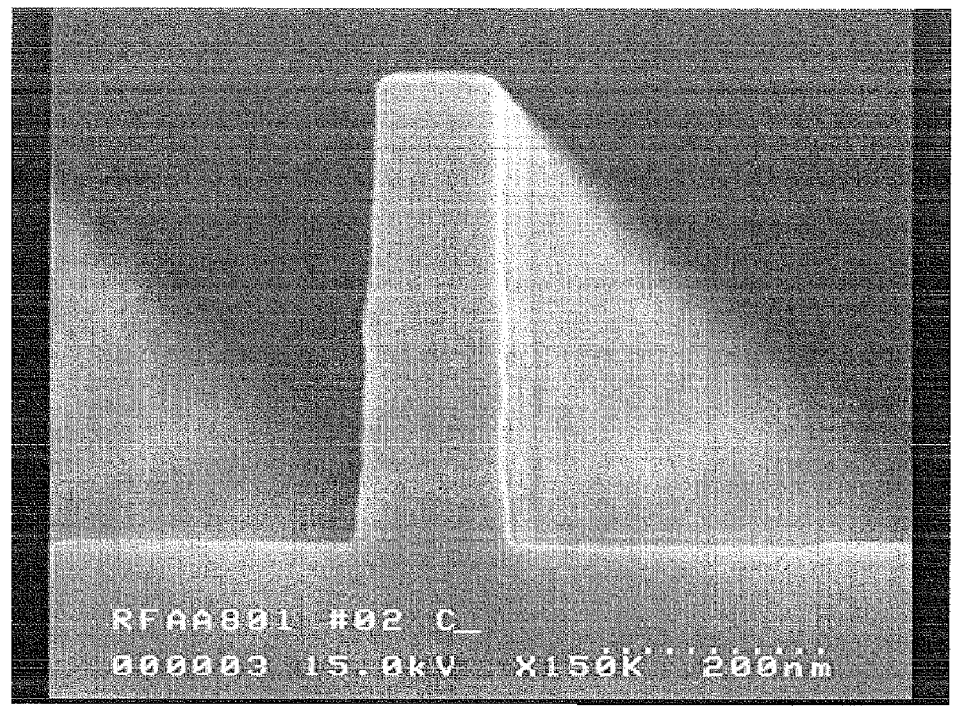
Figure 2B:
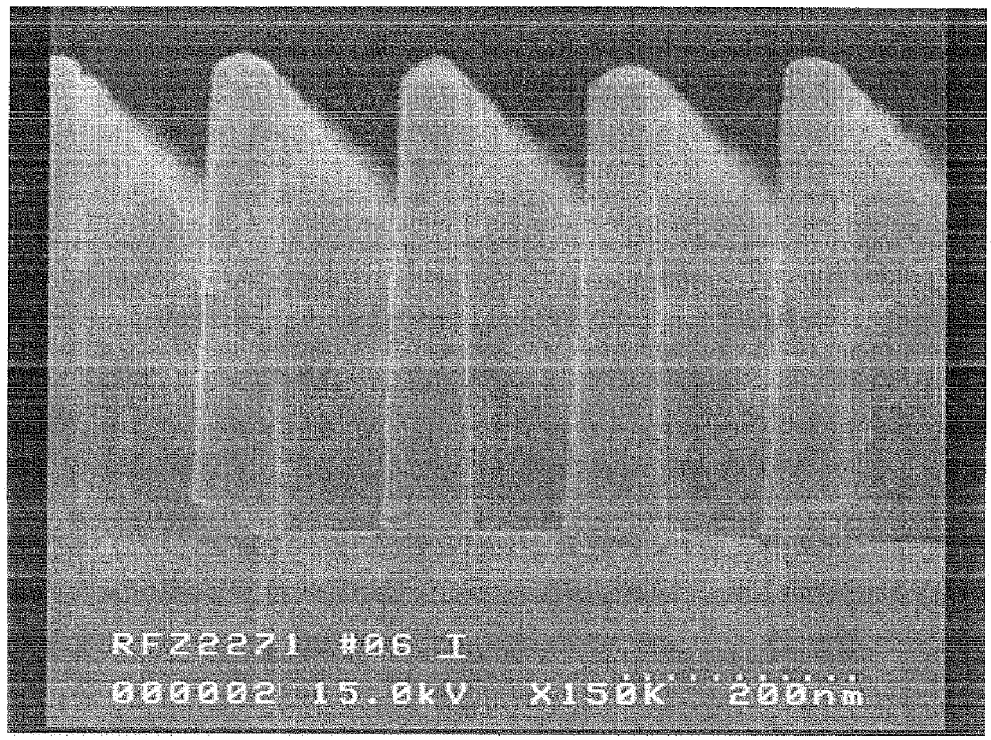
Figure 2B:
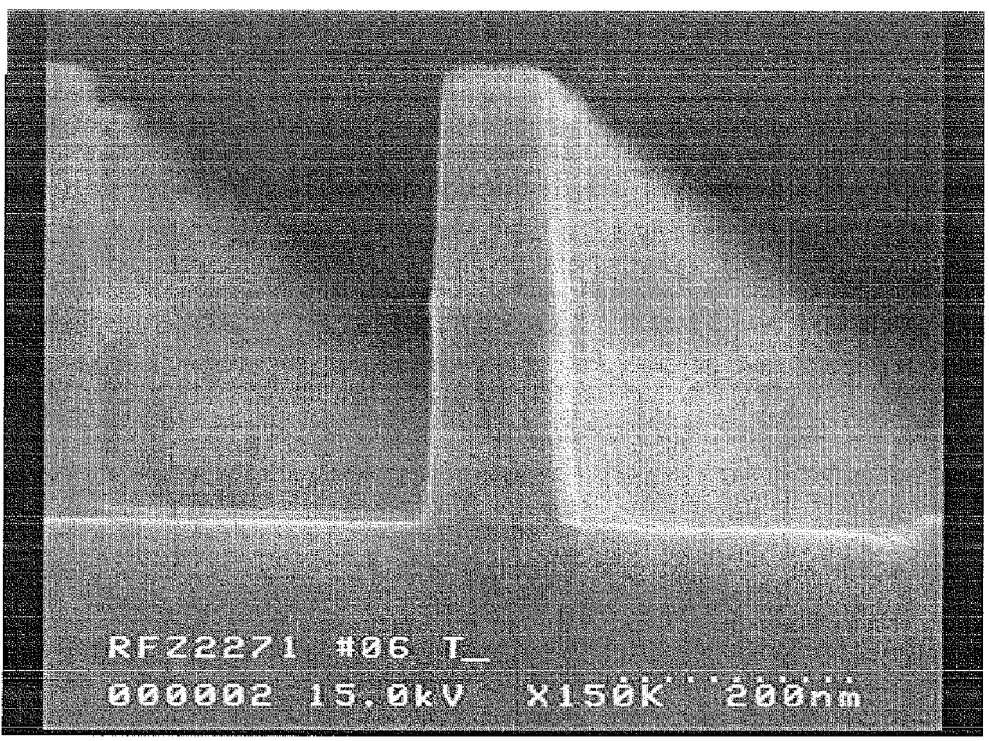

FIGS. 2A and 2B illustrate comparative transmission electron microscopic (TEM) images of patterns formed in a cell region and a peripheral region according to a conventional method and an embodied method of the present invention. Referring to FIG. 2A, as the top TEM image illustrates, the patterns in the cell region formed based on the conventional method have a vertical profile. As the bottom TEM image illustrates, the patterns in the peripheral region are formed to have larger CDs compared with the CDs of the patterns in the cell region.

Referring to FIG. 2B, as the top TEM image illustrates, the patterns formed in the cell region based on the embodied method of the present invention have a sloped profile. The patterns in the peripheral region are formed to have CDs substantially the same as those of the patterns in the cell region. Accordingly, the patterns in the cell region and the peripheral region are formed with a reduced CD bias relative to the conventional method.

According to various embodiments of the present invention, the CD of the resultant pattern structure in the cell region is substantially the same as the photosensitive pattern, while the CD of the resultant pattern structure in the peripheral region is decreased. Thus, the CD bias between the cell region and the peripheral region is reduced. The reduction in the CD bias contributes to an improvement of device characteristics.

While the present invention has been described with respect to various embodiments, it will be apparent to those skilled in the art that various changes and modifications may be made without departing from the spirit and scope of the invention as defined in the following claims.

What is claimed is:

1. A method for fabricating a semiconductor device, the method comprising:
    forming an etch target layer over a substrate, wherein the substrate includes a cell region and a peripheral region;
    forming a first hard mask layer, a second hard mask layer, and an anti-reflective coating layer over the etch target layer;
    forming a photosensitive pattern over the anti-reflective coating layer;
    etching the anti-reflective coating layer to have a width smaller than a width of the photosensitive pattern;
    etching the second hard mask layer;
    performing a main etching treatment and an over-etching treatment on the first hard mask layer to form first hard mask patterns in the cell region, wherein the first hard mask patterns have a sloped profile; and etching the etch target layer using the first hard mask patterns as an etch mask.

2. The method for fabricating a semiconductor device according to claim 1, wherein the first hard mask layer includes a nitride-based material, and the second hard mask layer includes a carbon-based material.

3. The method for fabricating a semiconductor device according to claim 1, wherein etching the anti-reflective coating layer comprises using a mixture gas including $CF_4$ gas, $CHF_3$ gas, and $O_2$ gas, wherein the $CF_4$ gas flows at a rate of approximately 50 sccm to 70 sccm, the $CHF_3$ gas flows at a rate of approximately 30 sccm to 50 sccm, and the $O_2$ gas flows at a rate of approximately 5 sccm to 10 sccm.

4. The method for fabricating a semiconductor device according to claim 3, wherein etching the anti-reflective coating layer proceeds under conditions of: a pressure of 100 mTorr to 150 mTorr; and a top power of approximately 200 W to 400 W.

5. The method for fabricating a semiconductor device according to claim 1, wherein etching the second hard mask layer comprises using a mixture gas including $N_2$ gas and $O_2$ gas, wherein the $N_2$ gas flows at a rate of approximately 30 sccm to 50 sccm, and the $O_2$ gas flows at a rate of approximately 50 sccm to 70 sccm.

6. The method for fabricating a semiconductor device according to claim 5, wherein etching the second hard mask layer proceeds under conditions of: a pressure of approximately 10 mTorr to 20 mTorr; and a top power of approximately 1,400 W to 1,600 W.

7. The method for fabricating a semiconductor device according to claim 1, wherein performing the main etching on the first hard mask layer comprises using an ending point detection mode.

8. The method for fabricating a semiconductor device according to claim 1, wherein performing the main etching and the over-etching on the first hard mask layer comprises flowing a CHF-based gas at different rates.

9. The method for fabricating a semiconductor device according to claim 8, wherein performing the main etching on the first hard mask layer comprises using a mixture gas including $CHF_3$ gas, $CF_4$ gas, and $O_2$ gas, wherein the $CHF_3$ gas flows at a rate of approximately 20 sccm to 40 sccm, the $CF_4$ gas flows at a rate of approximately 80 sccm to 100 sccm, and the $O_2$ gas flows at a rate of approximately 5 sccm to 10 sccm.

10. The method for fabricating a semiconductor device according to claim 9, wherein performing the main etching on the first hard mask layer proceeds under conditions of: a pressure of approximately 100 mTorr to 200 mTorr; a top power of approximately 100 W to 200 W; and a bottom power of approximately 700 W to 800 W.

11. The method for fabricating a semiconductor device according to claim 1, wherein performing the over-etching on the first hard mask layer comprises using $CHF_3$ gas and $O_2$ gas, wherein the $CHF_3$ gas flows at a rate of approximately 90 sccm to 110 sccm, and the $O_2$ gas flows at a rate of approximately 5 sccm to 10 sccm.

12. The method for fabricating a semiconductor device according to claim 11, wherein performing the over-etching on the first hard mask layer proceeds under conditions of: a pressure of approximately 100 mTorr to 200 mTorr; a top power of approximately 100 W to 200 W; and a bottom power of approximately 700 W to 800 W.

13. The method for fabricating a semiconductor device according to claim 1, wherein performing the over-etching on the first hard mask layer comprises over-etching the first hard mask layer in the cell region such that a resultant pattern has a sloped profile.

14. The method for fabricating a semiconductor device according to claim 1, wherein forming the etch target layer comprises forming the etch target layer to be one of a gate electrode and a bit line electrode.

15. The method for fabricating a semiconductor device according to claim 14, wherein forming the etch target layer comprises forming the etch target layer using one selected from a group consisting of polysilicon, metal and metal silicide.

16. The method for fabricating a semiconductor device according to claim 1, wherein the main etching treatment and the over-etching treatment are performed under different conditions that produce different amounts of polymers.

17. A method for fabricating a semiconductor device, the method comprising:

forming an etch target layer over a substrate, wherein the substrate includes a cell region and a peripheral region;

forming a first hard mask layer, a second hard mask layer, and an anti-reflective coating layer over the etch target layer;

forming a photosensitive pattern over the anti-reflective coating layer;

etching the anti-reflective coating layer to have a width that is smaller than a width of the photosensitive pattern;

etching the second hard mask layer; and etching the first hard mask layer such that the first hard mask layer in the peripheral region is etched more than the first hard mask layer in the cell region, wherein the etched first hard mask layer in the cell region has a sloped profile.

18. The method for fabricating a semiconductor device according to claim 17, wherein a width of the first hard mask layer in the cell region is larger than the width of the etched anti-reflective coating layer.

19. The method for fabricating a semiconductor device according to claim 17, wherein etching the first hard mask layer comprises flowing a CHF-based gas at different rates.

20. The method for fabricating a semiconductor device according to claim 17, wherein etching the first hard mask layer comprises over-etching the first hard mask layer in the cell region.

21. The method for fabricating a semiconductor device according to claim 17, further comprising etching the etch target layer.

* * * * *